US006545387B2

(12) United States Patent
Lee et al.

(10) Patent No.: US 6,545,387 B2
(45) Date of Patent: Apr. 8, 2003

(54) SURFACE ACOUSTIC WAVE FILTER USING NOVEL PIEZOELECTRIC SINGLE CRYSTAL SUBSTRATE

(75) Inventors: Sang-Goo Lee, Kyoungki-do (KR); Jin-Yong Kim, Seoul (KR); Hyeong-Joon Kim, Kyoungki-do (KR)

(73) Assignee: Ibule Photonics Co., Ltd. (KR)

( * ) Notice: Subject to any disclaimer, the term of this patent is extended or adjusted under 35 U.S.C. 154(b) by 0 days.

(21) Appl. No.: 09/823,578

(22) Filed: Mar. 30, 2001

(65) Prior Publication Data

US 2002/0185933 A1 Dec. 12, 2002

(51) Int. Cl.[7] .............................................. H01L 41/08
(52) U.S. Cl. .................................... 310/313 A; 310/358
(58) Field of Search ........................ 310/313 A, 313 R, 310/313 B, 311, 357, 358

(56) References Cited

U.S. PATENT DOCUMENTS 4,605,876 A * 8/1986 Ogawa et al. .............. 310/358
5,350,961 A * 9/1994 Chu ........................ 310/313 A
5,920,143 A * 7/1999 Tarui et al. ............. 310/313 A
6,231,779 B1 * 5/2001 Chiang et al. ............. 252/62.9
6,411,017 B1 * 6/2002 Qiu et al. ................... 310/358

* cited by examiner

*Primary Examiner*—Mark O. Budd
(74) *Attorney, Agent, or Firm*—Anderson Kill & Olick, PC

(57) ABSTRACT

A surface acoustic wave (SAW) filter comprising as a substrate a piezoelectric single crystal having the composition of formula (I) with high dielectric and piezoelectric constants, low temperature coefficient and good electromechanical properties has a high piezoelectric constant, a low insertion loss, and a broad bandwidth in a high frequency region, and therefore can be useful for preparing a SAW filter for high frequency telecommunication systems:

$$x(A)y(B)z(C)\text{—}p(P)n(N) \tag{I}$$

wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from Pt, Au, Ag, Pd and Rh, (N) is an oxide of a metal selected from Ni, Co, Fe, Sr, Sc, Ru, Cu and Cd, x is a number of 0.65 to 0.98, y is a number of 0.01 to 0.34, z is a number of 0.01 to 0.1, and p and n are each independently a number of 0.01 to 5.

7 Claims, 3 Drawing Sheets

SURFACE ACOUSTIC WAVE FILTER USING NOVEL PIEZOELECTRIC SINGLE CRYSTAL SUBSTRATE

FIELD OF THE INVENTION

The present invention relates to a surface acoustic wave (SAW) filter using a novel piezoelectric single crystal substrate, and more particularly to a high frequency SAW filter with a low propagation loss prepared by using a single crystal wafer of a composite metal material having a high dielectric constant, high piezoelectric constant, and good electromechanical properties.

BACKGROUND OF THE INVENTION

A surface acoustic wave (SAW) filter is a passive device designed to selectively pass desired signals and to suppress undesired signals in the electronic and telecommunication system. A SAW filter typically comprises a piezoelectric substrate in the form of a single crystal and input and output interdigital transducer (IDT) electrodes formed on the substrate, as shown in FIG. 1. When an electrical signal is applied to one of the two IDT electrodes, the piezoelectric substrate is stressed to generate a surface acoustic wave which propagates on the surface of the piezoelectric substrate and which is extracted as an electrical signal at the other IDT electrode.

In a SAW filter, the passband frequency is determined by both the velocity, of the surface acoustic wave generated on the substrate and the spacing between the two fingers of IDT, and it is typically represented by a center frequency, $f_0$, which is a ratio $V/\lambda_0$, V and $\lambda_0$ representing the propagation velocity of the surface acoustic wave and the finger spacing, respectively.

In conventional SAW filters which employ quartz, lithium tantalate ($LiTaO_3$) and lithium niobate ($LiNbO_3$) single crystals as a piezoelectric substrate and aluminum as an IDT material, the propagation velocities of the surface acoustic waves are reported to be 3,157 m/sec, 4,178 m/sec and 4,742 m/sec, respectively.

There have been hitherto attempted to increase the passband frequency of a SAW filter by reducing the finger spacing of IDT electrodes. However, when a passband frequency greater than 1 GHz is to be achieved by such spacing control, high-priced equipments such as a stepper and scanner should be used, and also need to utilize a shorter wavelength UV source and a special photoresist.

To avoid these problems, Japanese Patent Laid-open Publication No. sho 64-62911 discloses the use of a piezoelectric film deposited on sapphire or diamond as a material for increasing the velocity of the SAW, and U.S. Pat. No. 5,497,726 discloses a method of manufacturing a SAW element using a diamond substrate and at least one copper electrode. However, the SAW elements employing these materials are not amenable to commercialization due to high costs of the substrate materials.

Therefore, there has existed a need to develop a novel and economic substrate suitable for a high frequency and low loss SAW filter having broad bandwidth.

SUMMARY OF THE INVENTION

It is, therefore, a primary object of the invention to provide a novel piezoelectric substrate material suitable for preparing a high frequency surface acoustic wave filter having a low insertion loss, broad bandwidth in high frequency region.

In accordance with an aspect of the present invention, there is provided a surface acoustic wave filter comprising a piezoelectric single crystal substrate and two interdigital transducer (IDT) electrodes formed thereon, characterized in that the substrate has the composition of formula (I):

$$x(A)y(B)z(C)—p(P)n(N) \tag{I}$$

wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range of 0.01 to 0.34, z is a number in the range of 0.01 to 0.1, and p and n are each independently a number in the range of 0.01 to 5.

BRIEF DESCRIPTION OF THE DRAWINGS

The above and other objects and features of the present invention will become apparent from the following description thereof, when taken in conjunction with the accompanying drawings wherein.

DETAILED DESCRIPTION OF THE INVENTION

The present invention is characterized by employing a novel piezoelectric single crystal, having the composition of formula (I) as a piezoelectric substrate in fabricating a surface acoustic wave (SAW) filter.

The SAW filter comprises a single crystal substrate and input and output interdigital transducer(IDT) electrodes formed thereon, as mentioned above. In the present invention, the IDT electrode material may be any of those conventionally used, e.g., Au, Ag, Al, Ti, W, Mo or an alloy thereof, or a combination thereof.

The piezoelectric single crystal of formula (I) according to the present invention is a novel, homogeneous single crystal material and may be prepared by a solid phase reaction followed by melting-crystallization.

Specifically, in the solid phase reaction step, $Pb(Mg_{1/3}Nb_{2/3})O_3$ or $Pb(Zn_{1/3}Nb_{2/3})O_3$ is mixed with $PbTiO_3$ and $LiTaO_3$ in relative molar amounts ranging from 0.65 to 0.98, 0.01 to 0.34 and 0.01 to 0.1, respectively. Thereafter, to the resulting mixture, a metal selected from the group consisting of Pt, Au, Ag, Pd and Rh, and an oxide of a metal selected from the group consisting of Ni, Co, Fe, Sr, Sc, Ru, Cu and Cd are added in amounts ranging from 0.01 to 5% by weight based on the resulting mixture.

Subsequently, the resulting mixture was triturated in an organic solvent such as ethanol and isopropanol, dried at a temperature of 150 to 200° C., and calcined at a temperature of 850 to 1,000° C. for 1 to 10 hours.

The material thus obtained in the form of a ceramic powder is subjected to a post melting-crystallization step.

In the melting-crystallization step, the ceramic powder is allowed to melt at a high temperature of 1,300 to 1,500° C. under a pressure of 20 to 200 psi, and the melt is slowly cooled to room temperature over a period of 80 to 120 hours, rendering it to crystallize. The piezoelectric material obtained in this step is a single crystal having a homogeneous composition and its physicochemical characteristics are different from those of the ceramic powder obtained in the above solid phase reaction.

Figure 1:
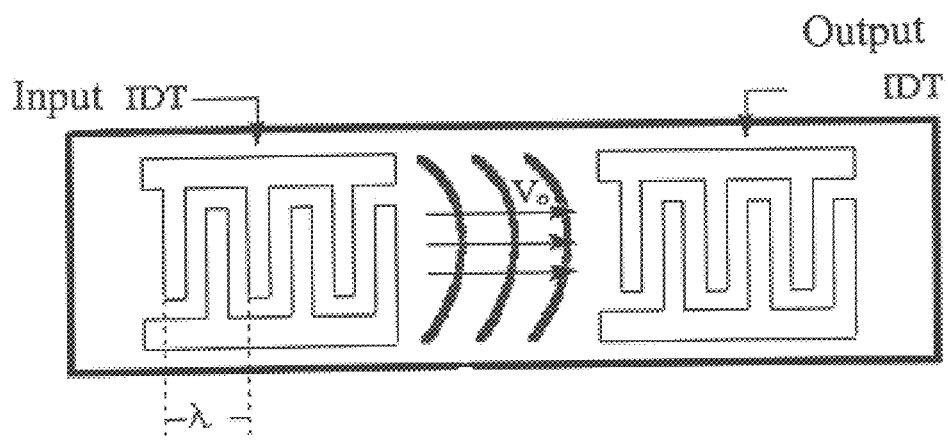
FIG. 1 shows a schematic view of a typical surface acoustic wave filter.
Figure 2:
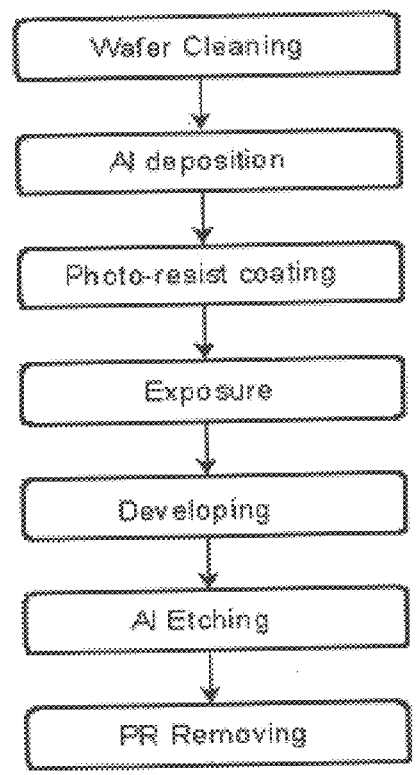
FIG. 2 is a block diagram showing a general procedure for preparing a surface acoustic wave filter.

The inventive SAW filter may be fabricated using the piezoelectric single crystal substrate by a conventional method, as shown in FIG. 2.

Specifically, the inventive piezoelectric single crystal prepared as above is processed to form a wafer, and the surface of the wafer is cleaned (a wafer cleaning step). Subsequently, an IDT electrode material is deposited on the surface of the wafer to a thickness of a few thousand Å by a sputtering or evaporation method (a deposition step), and a photoresist is coated thereon to a thickness of about 1 $\mu$m by a spin-coating or knife-coating method (a photoresist coating step). After a photomask having a desired electrode pattern is placed on the photoresist layer, the assembly is exposed to UV light (a UV exposure step). The exposed photoresist layer is developed by a conventional manner (a developing step) to form on the IDT material layer a fixed photoresist layer having the same pattern as the photomask pattern.

Subsequently, the IDT material layer not covered by the photoresist layer is etched by a wet or dry etching method using an etching solution or plasma (an etching step), and finally, the photoresist layer covering the patterned IDT material layer is removed by using a suitable solution (a photoresist removing step).

In the inventive SAW filter, the spacing and configuration of the two IDT electrodes may be controlled as desired depending on the final use of the filter.

The substrate used in inventive SAW filter has a dielectric constant of about 5,500 or higher and a piezoelectric constant of about 1,500 pC/N or higher at an ambient temperature.

Further, the inventive SAW filter has a low insertion loss of 2 dB at a high frequency of 100 MHz or more.

Accordingly, the inventive SAW filter can be beneficially used for filtering high frequency signals having a broad bandwidth at a broad temperature range with good stability and low driving voltage. For example, the inventive SAW filter may be a promising component for next-generation mobile telecommunication systems which operate in a high frequency region, e.g., IMT(international mobile telecommunication)-2000.

The following Examples are given for the purpose of illustration only and are not intended to limit the scope of the invention.

Preparative Example: Preparation of Single Crystal Substrate Materials

Raw materials as listed in Table 1 were metered and mixed, and the resulting mixture was triturated in an ethanol medium using a 0.5" zirconia ball mill. Subsequently, the resulting mixture was dried at about 150° C. in a controlled electric furnace, and calcined at about 920° C. for 6 hours in a capped alumina crucible.

The material thus obtained was pulverized with a ball mill. The powder was charged in a Pt crucible, and the crucible was covered and placed in a high temperature crystal growth furnace (1500° C., 100 psi) for 20 hours to melt the powder completely. The molten material was cooled slowly to 20° C. over 120 hours to obtain a semi-transparent, homogeneous single crystal.

TABLE 1

| Raw materials | X(A) | Y(B) | Z(C) | p(P) | n(N) | Composition Formula |
|---|---|---|---|---|---|---|
| Material 1 | Pb(Mg$_{1/3}$Nb$_{2/3}$)O$_3$ 0.8 mol | PbTiO$_3$ 0.18 mol | LiTaO$_3$ 0.02 mol | Pt 1 wt % | NiO 1 wt % | MPN |
| Material 2 | Pb(Mg$_{1/3}$Nb$_{2/3}$)O$_3$ 0.8 mol | PbTiO$_3$ 0.18 mol | LiTaO$_3$ 0.02 mol | Ag 1 wt % | NiO 1 wt % | MAN |
| Material 3 | Pb(Zn$_{1/3}$Nb$_{2/3}$)O$_3$ 0.89 mol | PbTiO$_3$ 0.09 mol | LiTaO$_3$ 0.02 mol | Pt 1 wt % | NiO 1 wt % | ZPN |
| Material 4 | Pb(Zn$_{1/3}$Nb$_{2/3}$)O$_3$ 0.89 mol | PbTiO$_3$ 0.09 mol | LiTaO$_3$ 0.02 mol | Ag 1 wt % | NiO 1 wt % | ZAN |

Footnote:
MPN: 0.8[Pb(Mg$_{1/3}$Nb$_{2/3}$)O$_3$]0.18[PbTiO$_3$]0.02[LiTaO$_3$]—1[Pt]1[NiO]
MAN: 0.8[Pb(Mg$_{1/3}$Nb$_{2/3}$)O$_3$]0.18[PbTiO$_3$]0.02[LiTaO$_3$]—1[Ag]1[NiO]
ZPN: 0.8[Pb(Zn$_{1/3}$Nb$_{2/3}$)O$_3$]0.18[PbTiO$_3$]0.02[LiTaO$_3$]—1[Pt]1[NiO]
ZAN: 0.8[Pb(Zn$_{1/3}$Nb$_{2/3}$)O$_3$]0.18[PbTiO$_3$]0.02[LiTaO$_3$]—1[Ag]1[NiO]

Example: Preparation of a Surface Acoustic Wave (SAW) Filter

Figure 4:
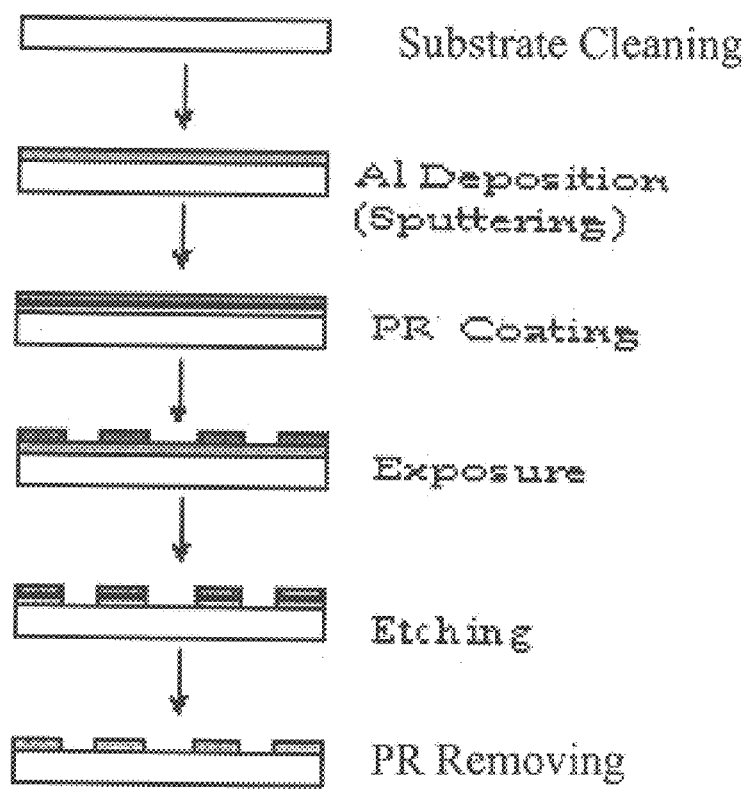
FIG. 4 is a block diagram showing the procedure for fabricating the surface acoustic wave filter of FIG. 3.

A SAW filter according to the present invention was prepared using the piezoelectric single crystal material prepared in Preparative Example, as shown in FIG. 4.

Material 1 prepared in Preparative Example was processed to form a wafer and the surface of the wafer was cleaned with a 5:95 mixture of DECONEX(a cleansing agent comprising wetting agents, emulsifiers, amphoteric surfactants, complexing agents, potassium phosphates, etc., a product of Borer Chemi) and deionized water in an ultrasonic cleaner at 40° C. for 20 minutes, rinsed and cleaned again by a conventional semiconductor surface cleaning process (a substrate cleaning step).

Figure 3:
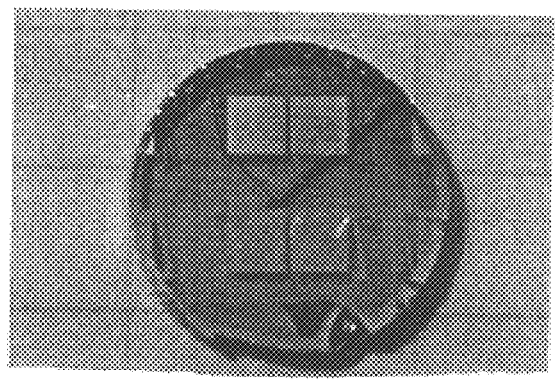
FIG. 3 is a photograph of a surface acoustic wave filter fabricated in Example according to the present invention.

On the surface of the single crystal wafer, an aluminum alloy (Al-0.5% Cu) was deposited at a thickness of about 1,000 Å by a sputtering method (an Al sputtering step), and subsequently, a photoresist was spin-coated thereon at a thickness of about 1 $\mu$m (a photoresist coating step). After a photomask having a desired electrode pattern was placed on the photoresist layer, the resulting assembly was exposed to UV light (an exposure step). The exposed photoresist layer was developed by a suitable developing solution and processed to obtain a fixed photoresist layer having the shape of the electrode pattern, and the exposed Al alloy layer was etched using a mixture of phosphoric acid, nitric acid and acetic acid (an etching step). Finally, the photoresist layer covering the patterned Al alloy layer was removed using a suitable solution (a photoresist removal step). The spacing between two IDT fingers of the SAW filter prepared as above was 40 $\mu$m. FIG. 3 is a photograph of the SAW filter thus prepared.

Figure 5:
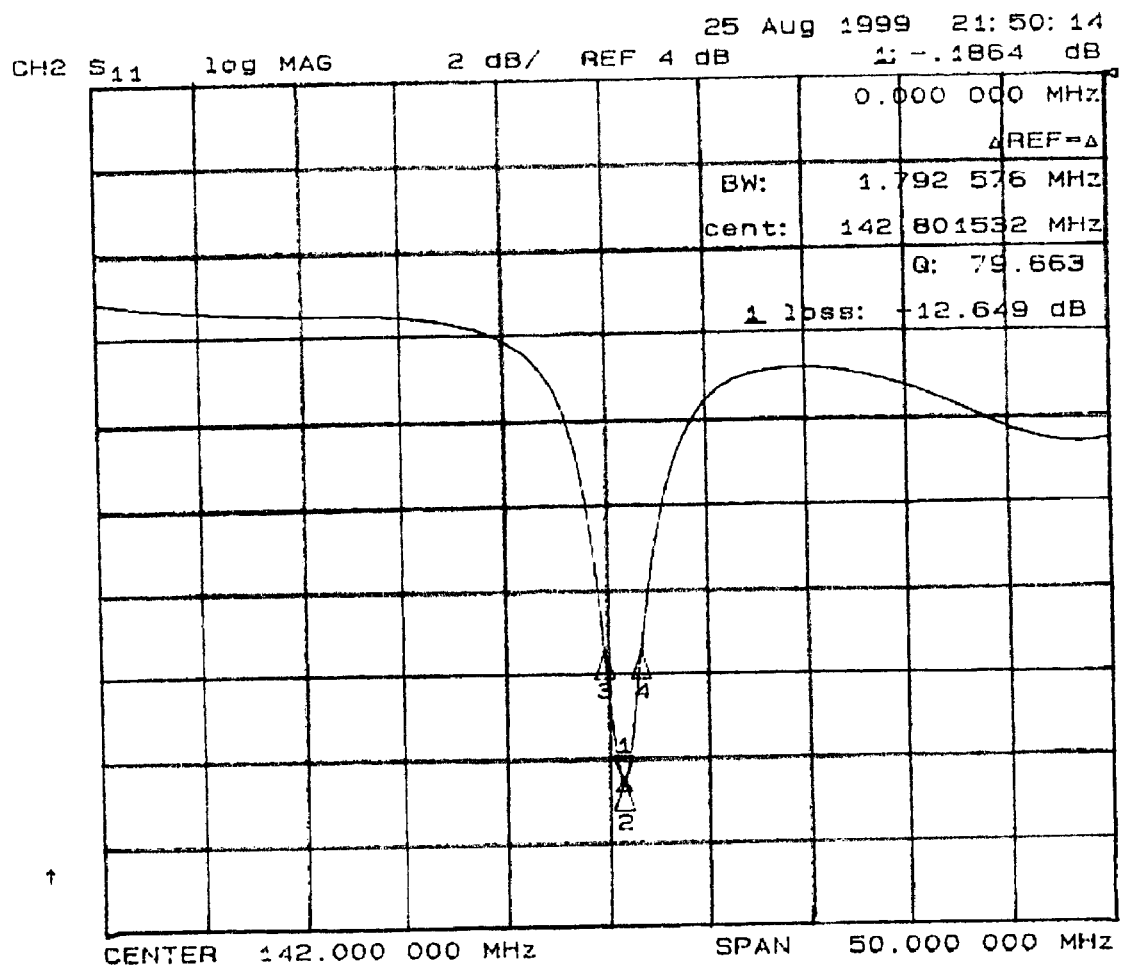
FIG. 5 shows the reflection characteristics of the surface acoustic wave filter of FIG. 3.

The reflection characteristics of the SAW filter were measured using a network analyzer with on-wafer probe. As can be seen from FIG. 5, the center frequency of the SAW filter is 142 MHz, and therefore, the propagation velocity of the surface acoustic wave thereof is 5,840 m/sec, which is higher than those of conventional SAW filters.

Accordingly, it is clear that the piezoelectric single crystal of formula (I) according to the present invention can be beneficially used as a substrate in preparing a SAW filter for the next generation mobile telecommunication such as IMT (international mobile telecommunication)-2000 for which the spacing between the fingers of IDT is designed to be about 2.8 $\mu$m.

While the invention has been described in connection with the above specific embodiments, it should be recognized that various modifications and changes may be made to the invention by those skilled in the art without departing from the scope of the invention as defined by the appended claims.

What is claimed is:

1. A surface acoustic wave filter comprising a piezoelectric single crystal substrate and two interdigital transducer (IDT) electrodes formed thereon, characterized in that the substrate has the composition of formula (I):

$$x(A)y(B)z(C)\text{—}p(P)n(N) \qquad (I)$$

wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range of 0.01 to 0.34, z is a number in the range of 0.01 to 0.1, p is a number in the range of 0.01 to 5, and n is a number in the range of 0.01 to 5.

2. The filter of claim 1, wherein the IDT electrode is made of a metal selected from the group consisting of Au, Ag, Al, Ti, W, Mo and an alloy thereof.

3. The filter of claim 1, wherein the piezoelectric single crystal is prepared by a process comprising the steps of (a) mixing one component selected from $Pb(Mg_{1/3}Nb_{2/3})O_3$ and $Pb(Zn_{1/3}Nb_{2/3})O_3$ with $PbTiO_3$, and $LiTaO_3$, in relative molar amounts ranging from 0.65 to 0.98, 0.01 to 0.34 and 0.01 to 0.1, respectively, (b) adding, to the mixture obtained in (a), a metal selected from the group consisting of Pt, Au, Ag, Pd and Rh, and an oxide of a metal selected from the group consisting of Ni, Co, Fe, Sr, Sc, Ru, Cu and Cd, in amounts ranging from 0.01 to 5% by weight based on the mixture, (c) calcining the mixture obtained in (b), followed by pulverizing the calcination product, (d) melting the powder obtained in (c), and (e) cooling the melt to crystallize.

4. The filter of claim 3, wherein the calcination step is conducted at a temperature of 850 to 1,000° C. for 1 to 10 hours.

5. The filter of claim 3, wherein the melting step is conducted at a temperature of 1,300 to 1,500° C. under a pressure of 20 to 200 psi.

6. The filter of claim 3, wherein the cooling step is conducted by slowly cooling the melt to room temperature over a period of 80 to 120 hours.

7. The filter of claim 1, which is used in a high frequency mobile telecommunication system or IMT (international mobile telecommunication)-2000.

* * * * *